United States Patent
Nakamura et al.

(10) Patent No.: US 6,764,718 B2
(45) Date of Patent: Jul. 20, 2004

(54) METHOD FOR FORMING THIN FILM FROM ELECTRICALLY INSULATING RESIN COMPOSITION

(75) Inventors: Takashi Nakamura, Chiba Prefecture (JP); Kiyotaka Sawa, Chiba Prefecture (JP); Akihiko Kobayashi, Chiba Prefecture (JP); Katsutoshi Mine, Chiba Prefecture (JP)

(73) Assignee: Dow Corning Toray Silicone Co., Ltd., Tokyo (JP)

( * ) Notice: Subject to any disclaimer, the term of this patent is extended or adjusted under 35 U.S.C. 154(b) by 0 days.

(21) Appl. No.: 10/315,337

(22) Filed: Dec. 9, 2002

(65) Prior Publication Data

US 2003/0091748 A1 May 15, 2003

Related U.S. Application Data

(62) Division of application No. 09/765,199, filed on Jan. 18, 2001, now abandoned.

(30) Foreign Application Priority Data

Jan. 31, 2000 (JP) ........................................ 2000-022624

(51) Int. Cl.$^7$ ............................. B05D 3/02; B05D 3/06; C08J 7/06; H01B 3/46
(52) U.S. Cl. ....................... 427/387; 427/496; 427/498; 427/503; 427/508; 427/512; 427/515; 252/573
(58) Field of Search ................................. 427/387, 496, 427/498, 503, 508, 512, 515; 252/573; 106/287.14; 525/474, 478, 479

(56) References Cited

U.S. PATENT DOCUMENTS

| 3,418,353 | A | * | 12/1968 | Brown ....................... 556/456 |
| 4,517,238 | A | * | 5/1985 | Mine et al. .................. 428/212 |
| 5,393,521 | A | * | 2/1995 | Lance-Gomez et al. . 424/70.12 |
| 5,422,412 | A | * | 6/1995 | Morita et al. .................. 528/25 |
| 6,143,360 | A | * | 11/2000 | Zhong ......................... 427/244 |
| 6,214,748 | B1 | * | 4/2001 | Kobayashi et al. .......... 438/782 |
| 6,252,030 | B1 | * | 6/2001 | Zank et al. .................... 528/31 |
| 6,340,735 | B1 | * | 1/2002 | Yagihashi ..................... 528/37 |
| 6,350,824 | B1 | * | 2/2002 | Baumann et al. ............ 525/479 |
| 6,387,997 | B1 | * | 5/2002 | Grolemund et al. ......... 524/506 |
| 6,451,436 | B1 | * | 9/2002 | Komatsu et al. ............ 428/447 |
| 6,541,107 | B1 | * | 4/2003 | Zhong et al. ............. 428/312.6 |

FOREIGN PATENT DOCUMENTS

| JP | 63-144524 | 6/1988 | ......... H01L/21/314 |
| JP | 63-144525 | 6/1988 | ......... H01L/21/314 |
| JP | 10-279687 | 10/1998 | ........... C08G/77/12 |
| JP | 10-283843 | 10/1998 | ............ H01B/3/46 |
| JP | 10-335324 | 12/1998 | ......... H01L/21/316 |
| JP | 11-135493 | 5/1999 | ......... H01L/21/312 |

* cited by examiner

Primary Examiner—Jeffrey B. Robertson
(74) Attorney, Agent, or Firm—Sharon K. Severance

(57) ABSTRACT

A method for forming an electrically insulating thin film coating the surface of an electronic device with an electrically insulating thin-film-forming resin composition and crosslinking the composition by a method selected from the group consisting of heating and irradiation with high-energy rays.

13 Claims, No Drawings ic # METHOD FOR FORMING THIN FILM FROM ELECTRICALLY INSULATING RESIN COMPOSITION

RELATED APPLICATIONS

The present application is a division of application Ser. No. 09/765,199 filed Jan. 18, 2001 now abandoned, entitled "Electrically Insulating Resin Composition and Method For Forming Thin Film Therefrom," now abandoned.

FIELD OF THE INVENTION

The present invention relates to an electrically insulating thin-film-forming resin composition, and to a method for forming an electrically insulating thin film. More particularly, it relates to an electrically insulating thin-film-forming resin composition with which it is possible to form an electrically insulating thin film having a low dielectric constant, and to a method for efficiently forming an electrically insulating thin film having a low dielectric constant on the surface of an electronic device.

BACKGROUND OF THE INVENTION

Examples of a method for forming an electrically insulating thin film on the surface of an electronic device include a method in which the surface of an electronic device is coated with a hydrogen silsesquioxane resin solution, the solvent is evaporated off, and the surface is then heated at 150 to 1000° C. (see Japanese Laid-Open Patent Application S63-144525), and a method in which the surface of an electronic device is coated with a solution of a hydrogen silsesquioxane resin and a platinum or rhodium catalyst, the solvent is evaporated off, and the surface is then heated at 150 to 1000° C. (see Japanese Laid-Open Patent Application S63-144524).

As miniaturization and integration have increased in electronic devices in recent years, there has been a need for a method for forming an electrically insulating layer with a low dielectric constant. More specifically, there is a need for a method for forming an electrically insulating layer with a low dielectric constant (a specific inductive capacity of less than 2.5) in a highly integrated circuit with a next-generation design rule of 0.15 µm or less. Accordingly, Japanese Laid-Open Patent Application H10-279687 proposes a method in which the surface of an electronic device is coated with a solution composed of a hydrogen silsesquioxane resin and two types of solvent with different boiling points or affinity to the resin, after which part of the solvent is evaporated, and the surface is heated to evaporate the solvent either during or after the crosslinking of the resin, thereby forming a porous electrically insulating crosslinked thin film.

Unfortunately, a porous electrically insulating thin film generally has poor mechanical strength and is susceptible to infiltration and attack by a variety of chemicals, and therefore cannot sufficiently stand up to the next-generation of multilayer wiring processes, and particularly to a copper dual damascene process, making such films impractical. Also, to form an electrically insulating thin film with a low dielectric constant, a relatively large amount of silicon atom-bonded hydrogen atoms must be present in the hydrogen silsesquioxane resin, and consequently the silicon atom-bonded hydrogen atoms in the thin film react due to the heat, various chemicals, or plasma encountered in the various steps following the formation of the thin film, such as the multilayer wiring of an electronic device, which further raises the density of the thin film and drives up the dielectric constant.

It is an object of the present invention to provide an electrically insulating thin-film-forming resin composition with which it is possible to form an electrically insulating thin film having a low dielectric constant, and to a method for efficiently forming an electrically insulating thin film having a low dielectric constant on an electronic device.

SUMMARY OF INVENTION

The present invention is an electrically insulating thin-film-forming resin composition comprising (A) an inorganic or organic electrically insulating resin having silicon atom-bonded hydrogen atoms, (B) a compound having groups able to react with the silicon atom-bonded hydrogen atoms in component (A) and having a boiling point under atmospheric pressure of at least 250° C., and (C) a solvent; and a method for forming an electrically insulating thin film therefrom.

DESCRIPTION OF THE INVENTION

The present invention is an electrically insulating thin-film-forming resin composition comprising (A) an inorganic or organic electrically insulating resin having silicon atom-bonded hydrogen atoms, (B) a compound having groups able to react with the silicon atom-bonded hydrogen atoms in component (A) and having a boiling point under atmospheric pressure of at least 250° C., and (C) a solvent; and a method for forming an electrically insulating thin film therefrom.

First, the electrically insulating thin-film-forming resin composition of the present invention will be described in detail. The electrically insulating resin of component A is an inorganic or organic electrically insulating resin having silicon atom-bonded hydrogen atoms, examples of which include inorganic resins that are silica precursor resins such as a hydrogen silsesquioxane resin or a partial hydrolyzate of an alkoxysilane having silicon atom-bonded hydrogen atoms; and organic resins having silicon atom-bonded hydrogen atoms, such as polyimide resins, fluorocarbon resins, benzocyclobutene resins, fluorinated polyallyl ether resins, and mixtures of two or more of these. Because of its superior electrical insulation properties, a silica resin precursor that forms silica upon curing is preferable as the electrically insulating resin of component A, and a hydrogen silsesquioxane resin is particularly favorable. This hydrogen silsesquioxane resin, described by average structure formula $(HSiO_{3/2})$, is a polymer whose main skeleton consists of trifunctional siloxane units expressed by formula $HSiO_{3/2}$. Examples of the groups at the molecular chain terminals of this hydrogen silsesquioxane resin include the hydroxyl group, the trimethylsiloxy group and other triorganosiloxy groups, and the dimethylhydrogensiloxy group and other triorganohydrogensiloxy groups. An example of a method for preparing this hydrogen silsesquioxane resin is the hydrolysis and polycondensation of trichlorosilane.

The compound of component (B) has groups able to react with the silicon atom-bonded hydrogen atoms in component (A). Examples of these groups able to react with silicon atom-bonded hydrogen atoms include aliphatic unsaturated hydrocarbon groups, alkoxy groups, and silanol groups, with aliphatic unsaturated hydrocarbon groups being particularly favorable. The compound of component (B) also has a boiling point under atmospheric pressure of at least 250° C. This is because a compound whose boiling point under atmospheric pressure is lower than 250° C. will evaporate before fully reacting with the silicon atom-bonded hydrogen atoms in component A, so the object of the present invention cannot be achieved. Examples of this compound of component B include 1,3-dihexenyl-1,1,3,3-tetramethyldisiloxane (b.p.=approximately 300° C.), 1,3,5,7,9-pentavinylcyclopentasiloxane (b.p.=approximately 261° C.), linear methylvinylsiloxane oligomers, and other such siloxane compounds; 1-octadecene (b.p.=approximately 313° C.) and other alkenes; trimethylolpropane monoallyl ether (b.p.=approximately 263° C.), and polyalkylene oxide diallyl ethers. There are no restrictions on the specific inductive capacity of component (B), but it is preferable to choose a compound with a low specific inductive capacity because the dielectric constant of the resulting electrically insulating resin can be further lowered.

There are no restrictions on the amount in which component (B) is contained in the present composition, but the amount is preferably such that there will be at least an equivalent amount of silicon atom-bonded hydrogen atoms in component (A) with respect to the groups able to react with silicon atom-bonded hydrogen atoms in component (B). An amount such that there are at least five equivalents of silicon atom-bonded hydrogen atoms in component (A) per reactive groups in component (B) is particularly favorable.

There are no particular restrictions on the solvent of component C as long as it will dissolve the above-mentioned components A and B without causing any chemical changes in them. Examples of solvents suitable as component C include toluene, xylene, and other aromatic solvents; hexane, heptane, octane, and other aliphatic solvents; methyl ethyl ketone, methyl isobutyl ketone, and other ketone-based solvents; butyl acetate, isoamyl acetate, and other aliphatic ester-based solvents; hexamethyldisiloxane, 1,1,3,3-tetramethyldisiloxane, and other linear methylsiloxanes, 1,1,3,3,5,5,7,7-octamethylcyclotetrasiloxane, 1,3,5,7-tetramethylcyclotetrasiloxane, and other cyclic siloxanes; and silane compounds such as tetramethylsilane and dimethyldiethylsilane. Methyl isobutyl ketone and siloxane solvents are particularly favorable.

There are no restrictions on the amount in which component (C) is contained in the present composition, but the amount is preferably at least 50 weight parts per 100 weight parts of component A. This is because it will tend to be difficult to apply a thin coating of the resulting resin composition over the surface of a base material such as an electronic device if component (C) content is below the lower limit of the above range.

It is also favorable for the present composition to contain (D) a catalyst which acts as a crosslinking accelerator to promote the reaction between the silicon atom-bonded hydrogen atoms in component (A) and the groups in component (B) capable of reacting with the silicon atom-bonded hydrogen atoms. The addition of component (D) allows component (A) in the present composition to be crosslinked at a relatively low temperature. Examples of this catalyst of component (D) include particulate platinum, chloroplatinic acid, an alcohol solution of chloroplatinic acid, an olefin complex of platinum, an alkenylsiloxane complex of platinum, a carbonyl complex of platinum, and other such platinum-based catalysts; rhodium catalysts; dibutyltin diacetate, dibutyltin dioctoate, and other such tin-based catalysts; and tetrabutyl titanate, tetrapropyl titanate, and other such titanium-based catalysts. The amount in which component (D) is contained in the present composition is preferably between 1 and 1000 weight parts per million weight parts of component (A) and component (B) combined. A sensitizer may also be added if the present composition is to be crosslinked solely by irradiation with high-energy rays.

The method of the present invention for forming an electrically insulating thin film will now be described in detail. The method for forming an electrically insulating thin film is characterized in that the surface of an electronic device is coated with the above-mentioned electrically insulating thin-film-forming resin composition and all or part of the solvent is evaporated, after which the electrically insulating organic resin contained in the composition is crosslinked by heating and/or irradiation with high-energy rays.

Examples of methods for coating the electronic device surface with the electrically insulating thin-film-forming resin composition include spin coating, dip coating, spray coating, and flow coating.

The electrically insulating resin in the above-mentioned composition is crosslinked by heating and/or irradiation with high-energy rays. When the resulting electrically insulating thin film needs to be smooth, it is preferable to heat it at a temperature higher than the melting point of component (A). Examples of heating methods include the use of a heating furnace or a hot plate. When irradiation with high-energy rays is employed, examples of high-energy rays that can be used include ultraviolet rays, infrared rays, X-rays, and an electron beam. The use of an electron beam is particularly favorable because component A can be thoroughly crosslinked.

EXAMPLES

The electrically insulating thin-film-forming resin composition and the method for forming an electrically insulating thin film of the present invention will now be described in detail through examples. The degree of crosslinking in the examples was determined by measuring the percent of residual SiH in the electrically insulating thin film by Fourier transform UV absorption spectrographic analysis. The percentage residual SiH percentage in the electrically insulating thin film is based on the amount of silicon atom-bonded hydrogen atoms remaining in the cured electrically insulating thin film when the amount of silicon atom-bonded hydrogen atoms contained in the electrically insulating thin-film-forming resin composition immediately after spin coating on a silicon wafer is 100%. The specific inductive capacity of the electrically insulating thin film was measured by an impedance analyzer (sandwiched aluminum electrode type) at 25° C. and 1 MHz using an electrically insulating thin film formed on a silicon wafer with a volumetric resistivity of $10^{-2}$ Ω·cm or less.

Example 1

An electrically insulating thin-film-forming resin composition was prepared composed of 22 wt % hydrogen silsesquioxane resin described by average structure formula $(HSiO_{3/2})$, 5 wt % 1,3-dihexenyl-1,1,3,3-tetramethyldisiloxane (b.p.=approximately 300° C.; molar ratio of silicon atom-bonded hydrogen atoms in the silsesquioxane resin to the hexenyl groups in this component: 7.7), and 73 wt % 1,1,1,3,3,5,5,5-octamethyltrisiloxane. This composition was then spin coated on a silicon wafer for 5 seconds of pre-spinning (500 rpm) and 10 seconds of main spinning (3000 rpm), after which the coating was irradiated with an electron beam (300 Mrad) accelerated at 165 kV, forming an electrically insulating thin film with a thickness of 750 nm, a residual SiH content of 70%, and a specific inductive capacity of 2.5.

Example 2

An electrically insulating thin-film-forming resin composition was prepared composed of 22 wt % hydrogen silsesquioxane resin described by average structure formula $(HSiO_{3/2})$, 5 wt % 1,3-dihexenyl-1,1,3,3-tetramethyldisiloxane (b.p.=approximately 300° C.; molar ratio of silicon atom-bonded hydrogen atoms in the silsesquioxane resin to the hexenyl groups in this component: 7.7), and 73 wt % 1,1,1,3,3,5,5,5-octamethyltrisiloxane. This composition was then spin coated on a silicon wafer for 5 seconds of pre-spinning (500 rpm) and 10 seconds of main spinning (3000 rpm), after which the coating was irradiated with an electron beam (300 Mrad) accelerated at 165 kV, and was then heated for 1 hour in a quartz furnace (400° C.) under a nitrogen atmosphere, forming an electrically insulating thin film with a thickness of 720 nm, a residual SiH content of 40%, and a specific inductive capacity of 2.4.

Example 3

An electrically insulating thin-film-forming resin composition was prepared composed of 22 wt % hydrogen silsesquioxane resin described by average structure formula ($HSiO_{3/2}$), 5 wt % 1,3-dihexenyl-1,1,3,3-tetramethyldisiloxane (b.p.=approximately 300° C.; molar ratio of silicon atom-bonded hydrogen atoms in the silsesquioxane resin to the hexenyl groups in this component: 7.7), 73 wt % 1,1,1,3,3,5,5,5-octamethyltrisiloxane, and 100 ppm chloroplatinic acid hexahydrate. This composition was then spin coated on a silicon wafer for 5 seconds of pre-spinning (500 rpm) and 10 seconds of main spinning (3000 rpm), after which the coating was heated for 1 hour in a quartz furnace (250° C.) under a nitrogen atmosphere and then heated for another hour in a quartz furnace (400° C.) under a nitrogen atmosphere, forming an electrically insulating thin film with a thickness of 710 nm, a residual SiH content of 40%, and a specific inductive capacity of 2.4.

Example 4

An electrically insulating thin-film-forming resin composition was prepared composed of 22 wt % hydrogen silsesquioxane resin described by average structure formula ($HSiO_{3/2}$), 62 wt % 1,3-dihexenyl-1,1,3,3-tetramethyldisiloxane (b.p.=approximately 300° C.; molar ratio of silicon atom-bonded hydrogen atoms in the silsesquioxane resin to the hexenyl groups in this component: 0.6), and 16 wt % 1,1,1,3,3,5,5,5-octamethyltrisiloxane. This composition was then spin coated on a silicon wafer for 5 seconds of pre-spinning (500 rpm) and 10 seconds of main spinning (3000 rpm), after which the coating was irradiated with an electron beam (300 Mrad) accelerated at 165 kV, and was then heated for 1 hour in a quartz furnace (400° C.) under a nitrogen atmosphere, forming an electrically insulating thin film with a thickness of 750 nm, a residual SiH content of 30%, and a specific inductive capacity of 2.3.

Example 5

An electrically insulating thin-film-forming resin composition was prepared composed of 22 wt % hydrogen silsesquioxane resin described by average structure formula ($HSiO_{3/2}$), 5 wt % 1-octadecene (b.p.=approximately 313° C.; molar ratio of silicon atom-bonded hydrogen atoms in the silsesquioxane resin to the unsaturated groups in this component: 7.3), and 73 wt % methyl isobutyl ketone. This composition was then applied by spin coating over a silicon wafer for 5 seconds of pre-spinning (500 rpm) and 10 seconds of main spinning (3000 rpm), after which the coating was irradiated with an electron beam (300 Mrad) accelerated at 165 kV, and was then heated for 1 hour in a quartz furnace (450° C.) under a nitrogen atmosphere, forming an electrically insulating thin film with a thickness of 800 nm, a residual SiH content of 40%, and a specific inductive capacity of 2.4.

Comparative Example 1

An electrically insulating thin-film-forming resin composition was prepared composed of 22 wt % hydrogen silsesquioxane resin described by average structure formula ($HSiO_{3/2}$) and 78 wt % 1,1,1,3,3,5,5,5-octamethyltrisiloxane. This composition was then spin coated on a silicon wafer for 5 seconds of pre-spinning (500 rpm) and 10 seconds of main spinning (3000 rpm), after which the coating was heated for 1 minute each on 150° C., 250° C., and 350° C. hot plates, and was then heated for 1 hour in a quartz furnace (400° C.) under a nitrogen atmosphere, forming an electrically insulating thin film with a thickness of 520 nm, a residual SiH content of 70%, and a specific inductive capacity of 3.0.

We claim:

1. A method for forming an electrically insulating thin film comprising
    coating the surface of an electronic device with an electrically insulating thin-film-forming resin composition comprising
        (A) an inorganic or organic electrically insulating resin having silicon atom-bonded hydrogen atoms,
        (B) a compound having groups able to react with the silicon atom-bonded hydrogen atoms in component (A) and having a boiling point under atmospheric pressure of at least 250° C., and
        (C) a solvent; evaporating all or part of the solvent, and
    crosslinking the composition by a method selected from the group consisting of heating and irradiation with high-energy rays.

2. The method as claimed in claim 1 where component (A) is a hydrogen silsesquioxane resin and the groups in component (B) able to react with silicon atom-bonded hydrogen atoms are aliphatic unsaturated hydrocarbon groups.

3. The method as claimed in claim 1 wherein the electrically insulating thin-film-forming resin composition further comprises (D) a platinum-based catalyst.

4. The method as claimed of claim 1, wherein in the electrically insulating thin-film-forming resin composition there is at least an equivalent amount of silicon atom-bonded hydrogen atoms in component (A) with respect to the groups able to react with silicon atom-bonded hydrogen atoms in component (B).

5. The method as claimed in claim 1, wherein in the electrically insulating thin-film-forming resin composition there is at least five equivalents of silicon atom-bonded hydrogen atoms in component (A) with respect to the groups able to react with silicon atom-bonded hydrogen atoms in component (B).

6. The method as claimed in claim 1, where component (B) is selected from the group consisting of 1,3-dihexenyl-1,1,3,3-tetramethyldisiloxane and 1-octadecene.

7. The method as claimed in claim 1, where the solvent is selected from the group consisting of methyl isobutyl ketone and siloxane.

8. The method as claimed in claim 1 wherein spin-coating is used to coat the surface of the electronic device.

9. The method as claimed in claim 1 wherein the composition is crosslinked by heating.

10. The method as claimed in claim 9 wherein the composition is crosslinked by heating to a temperature higher than the melting point of component (A).

11. The method as claimed in claim 1 wherein the composition is crosslinked by irradiation with high-energy rays.

12. The method as claimed in claim 11 wherein the high-energy rays are selected from ultraviolet rays, infrared rays, X-rays and electron beam.

13. The method as claimed in claim 12 wherein the high-energy rays are electron beam.

* * * * *